(12) United States Patent
Wolfel

(10) Patent No.: US 8,354,594 B2
(45) Date of Patent: Jan. 15, 2013

(54) WIRE-PRINTED CIRCUIT BOARD OR CARD COMPRISING CONDUCTORS WITH A RECTANGULAR OR SQUARE CROSS SECTION

(75) Inventor: Markus Wolfel, Lauf (DE)

(73) Assignee: Jumatech, GmbH (DE)

( * ) Notice: Subject to any disclaimer, the term of this patent is extended or adjusted under 35 U.S.C. 154(b) by 110 days.

(21) Appl. No.: 11/814,425

(22) PCT Filed: Jan. 24, 2006

(86) PCT No.: PCT/EP2006/000612
§ 371 (c)(1),
(2), (4) Date: Oct. 18, 2007

(87) PCT Pub. No.: WO2006/077163
PCT Pub. Date: Jul. 27, 2006

(65) Prior Publication Data
US 2008/0128158 A1 Jun. 5, 2008

(30) Foreign Application Priority Data
Jan. 24, 2005 (DE) ............... 20 2005 001 161 U

(51) Int. Cl.
*H05K 1/00* (2006.01)
(52) U.S. Cl. .................... 174/252; 505/230
(58) Field of Classification Search ........ 174/252; 505/230–232, 430–432
See application file for complete search history.

(56) References Cited

U.S. PATENT DOCUMENTS

| | | | |
|---|---|---|---|
| 3,427,714 A * | 2/1969 | Lemelson | 29/849 |
| 6,008,987 A | 12/1999 | Gale et al. | |
| 6,127,634 A * | 10/2000 | Higashiguchi et al. | 174/262 |
| 6,800,807 B2 | 10/2004 | Ishiguro et al. | |
| 2001/0017422 A1 | 8/2001 | Oda | |
| 2002/0130739 A1 * | 9/2002 | Cotton | 333/238 |
| 2003/0188889 A1 * | 10/2003 | Straub et al. | 174/262 |

FOREIGN PATENT DOCUMENTS

| | | |
|---|---|---|
| DE | 19618917 C1 | 10/1997 |
| EP | 0217156 * | 4/1987 |
| JP | 63-000195 A | 1/1988 |
| JP | 10-215093 A | 8/1998 |
| JP | 2001-176967 A | 6/2001 |
| WO | 93/26141 A1 | 12/1993 |

OTHER PUBLICATIONS

International Search Report for International Application No. PCT/EP2006/000612, mailed Oct. 25, 2006, 2 pages.
English Language Abstract of DE 19 61 8917 C1.
German language International Preliminary Examination Report on Patentability for international application No. PCT/EP2006/000612, international filing date of Jan. 1, 2006, mailed Apr. 2, 2007, 8 pages.

(Continued)

*Primary Examiner* — Jeremy Norris
(74) *Attorney, Agent, or Firm* — Cantor Colburn LLP

(57) ABSTRACT

The invention relates to a wire-printed circuit board or card (1) comprising etched strip conductors (2) and wire conductors (6), which wire conductors run on and/or in the circuit board or card (1) between connection points (4). At least one of the wire conductors (6) has an essentially rectangular, for example, a square, cross-section.

14 Claims, 3 Drawing Sheets

OTHER PUBLICATIONS

English translation of official action dated Sep. 15, 2011, in corresponding Chinese Patent Application No. 200680003062, 3 pages.
English Language Abstract of JP 03-242996.
English Language Abstract of JP 10-215093.
English Language Abstract of JP 2001-176967.
English translation of official action dated Aug. 2, 2011, in corresponding Japanese Patent Application No. 2007-551635, 5 pages.
Partial English translation of Japanese Patent Document JP 63-000195, published Jan. 5, 1988, 2 pages.

* cited by examiner

WIRE-PRINTED CIRCUIT BOARD OR CARD COMPRISING CONDUCTORS WITH A RECTANGULAR OR SQUARE CROSS SECTION

BACKGROUND OF THE INVENTION

1. Field of the Invention

The invention relates to a wire-printed circuit board or card comprising etched strip conductors and conductors that run on or in the circuit board or card between connection points.

2. Related Art

Normally strip conductors are produced on cards or circuit boards by means of the etching method, i.e., areas of a copper film applied to a support board are etched away between the desired strip conductors. With wire-printed circuit boards or cards, on the other hand, conductors made of electrically conductive material are laid between connection points arranged on the card for the electronic components to be placed on the card and, for example, cast, together with the card, into a block of insulating compound using a sandwich construction. A method for producing such a wire-printed circuit board or card is known, for example, from DE 196 18 917 C1. Therefore, a distinction is to be made between wire-printed cards on or in which conductors are laid between connection points of electronic components and line links in which only currents or signals between separated cards or printed circuit boards are to be transmitted by the conductors.

For complex circuits on cards, often a large number of crossing conductors is needed on the card, which then takes up a relatively large constructed space. Furthermore, particularly when the card or printed circuit board is used in the field of power electronics, thermal problems in the form of overheating arise.

SUMMARY OF THE INVENTION

The object of the invention under consideration is therefore to further develop a wire-printed circuit board or card of the type mentioned at the beginning in such a way that the disadvantages described above are largely avoided. This object is solved according to the invention by providing a wire-printed circuit board or card comprising etched strip conductors and wire conductors that run in or on the circuit board or card between connection points, wherein at least one of the wire conductors has a rectangular cross-section and a side of the wire conductor faces towards the major surface of the printed circuit board or card, provided that, in the case of a non-square rectangular cross-section or a wire conductor, a side of the wire conductor with the greater expansion faces towards the major surface.

Generally, the present invention is based on the idea of forming at least some of the conductors laid on a card or printed circuit board so that they have a cross-section that is rectangular or square. The advantages over conductors with a circular cross-section associated with this can particularly be seen in the fact that the interspaces between the individual conductors can be smaller, and so it is possible to achieve a higher packing density. Furthermore, larger line cross-sections can be achieved in the same constructed space, which is advantageous, particularly when conductors are used in power electronics, where large conductive cross-sections are important for reasons of temperature. Furthermore, in the case of larger line cross-sections, a lower line resistance is also achieved, so that even very high currents can be transmitted with a low loss. Hence it is also possible to arrange both the power electronics and the circuit electronics on a single printed circuit board.

Furthermore, crossings of current-carrying conductors formed according to the invention can be realised, because the contact surface of the conductors is larger, and therefore it is easier to insert insulating intermediate layers. Moreover, with given line cross-sections, there is a lower overall height at crossings than with conductors having a circular cross-section.

Advantageous further developments and improvements of the present invention are possible by means as described below.

Particularly preferably, for at least some of the conductors with rectangular cross-section, the side with the greater expansion points towards the printed circuit board. The result is then firstly, a flat overall height, and secondly, the possibility of fixing the conductors in place, for example by moulding with an electrically insulating material, on the card more easily because of the slighter tendency to tip or twist.

According to a further development, at least some of the conductors have a hollow cross-section in which a medium circulates. The medium can be a gas or liquid. For example, the medium can be a coolant for cooling the printed circuit board. This development is particularly advantageous when conductors through which high current flows, such as are used in power electronics, are used, because the temperature is reduced in this way. For certain uses of the printed circuit board it can also be advantageous if the medium is a means for heating, e.g., a heated liquid or a gas. This can be advantageous, particularly in cold environments or for quickly reaching the operating temperature of the printed circuit board. It is also possible to compensate large temperature fluctuations of the environment by means of heating or cooling if the printed circuit board is subjected to climate control, so to speak.

BRIEF DESCRIPTION OF THE DRAWINGS

In the following, embodiments of the invention are depicted in the drawing and explained in more detail in the subsequent description. Shown in the drawing are.

DETAILED DESCRIPTION OF THE INVENTION

Figure 1:
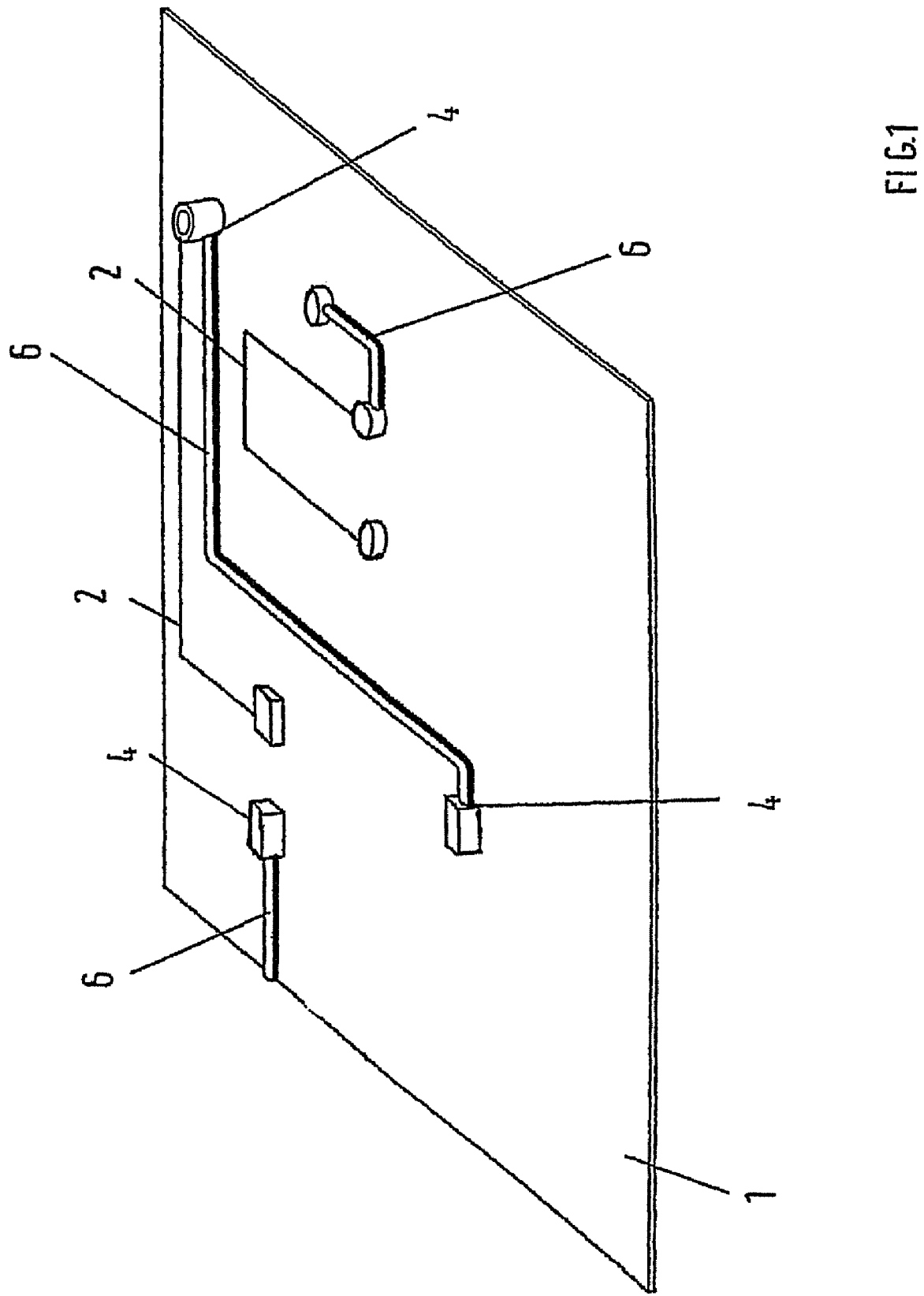
FIG. 1 is a perspective view of a printed circuit board in which a number of electrically conductive conductors connect connection points for electronic components to one another.

The electrically insulating printed circuit board, indicated as a whole as 1 in FIG. 1, is preferably an etched printed circuit board, i.e., very flat strip conductors 2 made of copper are found on its surface, these strip conductors forming an electric circuit.

In addition, power electronics are realised on the printed circuit board 1, with electronic power components that are not shown, with the, for example, etched connection points 4 of these components being connected by means of electrically conductive conductors 6. The conductors 6 therefore contact at defined connection points 4 of electronic components of the circuit the printed circuit board 1. This contacting is brought about by, for example, welding, bonding, soldering, conductive gluing or the like. The conductors 6 are, for example, provided with insulation in order to make it possible to arrange them one above the other in several levels. Such a printed circuit board is designated as the wire-printed circuit board 1. The printed circuit board 1 is furthermore cast on its side facing the conductors 6 to these by means of an electrically insulating compound in a sandwich structure. The structure and manufacture of such a wire-printed circuit board 1 are known, for example, from DE 196 18 917 C1, so that this is not discussed further here. In the case at hand, therefore, a combination of etched strip conductors 2 with wire connections with conductors 6 is realised on the printed circuit board.

Figure 2:
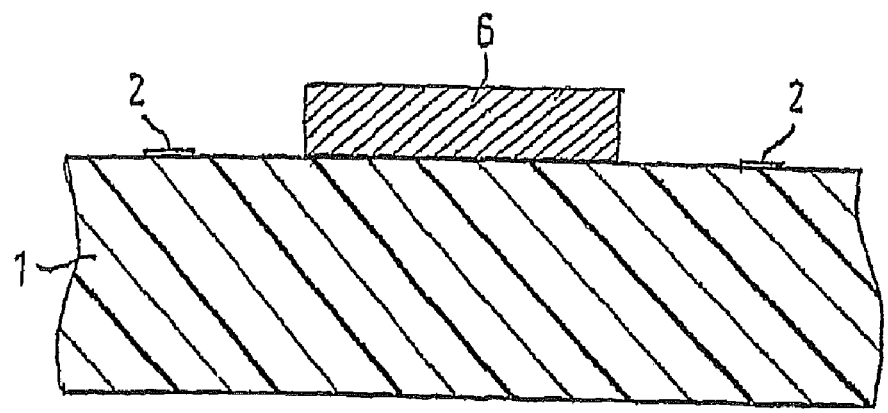
FIG. 2 is a partial cross-sectional depiction through the printed circuit board of FIG. 1 with a conductor with a rectangular cross-section according to a preferred embodiment of the invention.

According to the invention, at least some of the conductors 6 have a rectangular cross-section, as can be seen in FIG. 2. Preferably such a conductor 6 is formed as copper flat-wire, with the dimensions 0.8×0.3 mm. The side of the conductors 6 with the greater expansion points towards the printed circuit board 1, for example.

Figure 3:
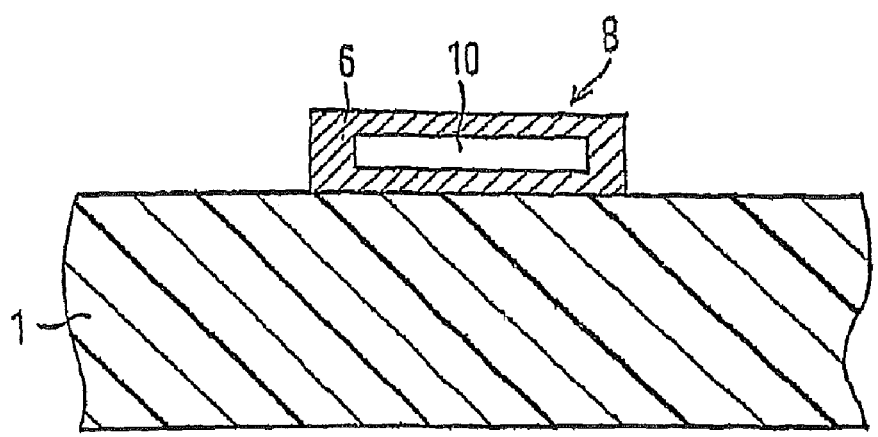
FIG. 3 is a partial cross-sectional depiction through the printed circuit board of FIG. 1 with a conductor with a hollow rectangular cross-section according to a further embodiment of the invention.
Figure 7:
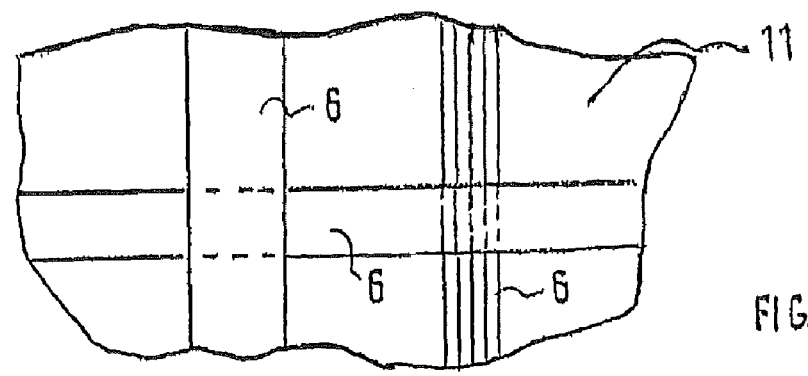
FIG. 7 is a partial plan view of yet another embodiment of the printed circuit board of FIG. 6, with the top layer removed, and in which rectangular conductors cross each other within the printed circuit board.

According to a further embodiment shown in FIG. 3, at least some of the conductors 6 have a hollow cross-section 8, in which preferably a coolant 10 or even only air circulates.

According to an alternative, the etching of the copper film attached to the surface of the printed circuit board can also always be done after the laying or wire-printing of the conductors, in order to work the connection points out of the copper film. Because these are, however, already known ahead of time according to the existing circuit layout, the connections of the conductors to the connection points, which do not actually exist at the time, can already be produced in advance. Furthermore, the surface of the printed circuit board provided with the conductors can be provided with a covering layer by means of pressing a prepreg made of an insulating compound to the printed circuit board, for example.

Figure 4:
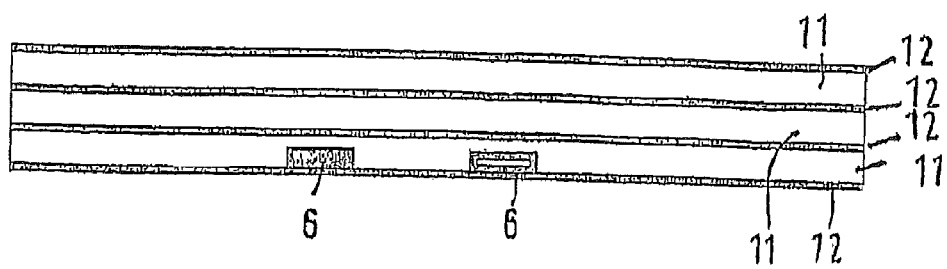
FIG. 4 is a partial cross-sectional view of the printed circuit board of FIG. 1 with a rectangular conductor, as seen from the cross-section, and a hollow conductor, as seen from the cross-section, and in which the printed circuit board is constructed with a number of layers.
Figure 5:
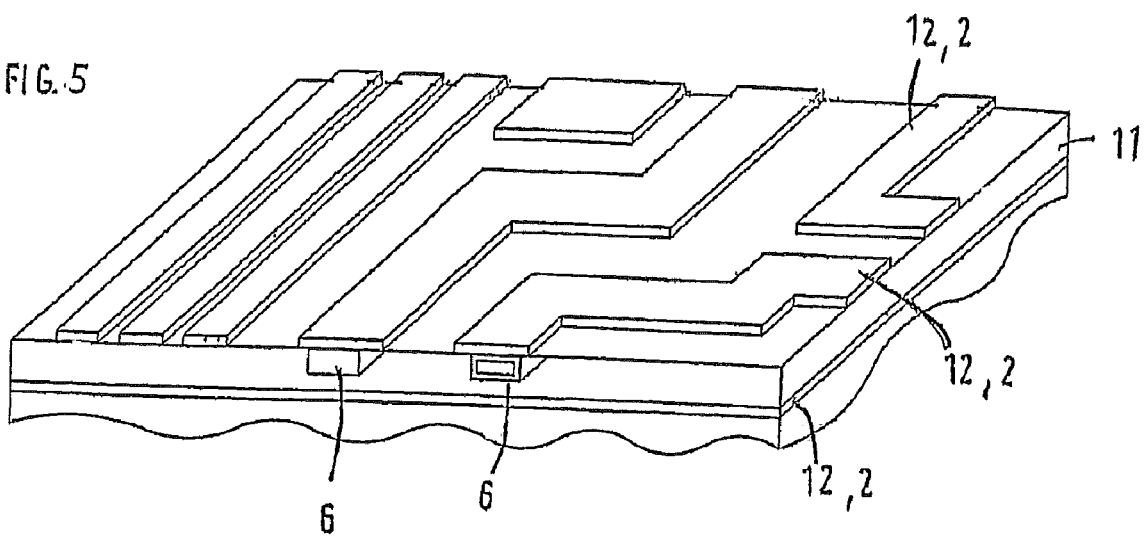
FIG. 5 is a more detailed perspective view of the printed circuit board of FIG. 4.

FIGS. 4 and 5 show a further embodiment, in which the printed circuit board is built up of a number of layers 12 made of conductive material, such as copper, for example. The conductors 6 with a rectangular or hollow cross-section here are located in the printed circuit board. The conductors 6 are, e.g., moulded into an insulating material 11, which electrically separates the layers 12 from one another. Strip conductors 2 created by etching are shown on the exterior side of the printed circuit board. These strip conductors can, e.g., border on the rectangular or hollow conductors, as seen in the cross-section, or can be connected to them. In this embodiment, the conductors 6 with a rectangular or hollow cross-section are not visible from outside, but they run along assigned strip conductors. The layers 12 and the insulating material are pressed with the conductors 6 and any other components into a printed circuit board in the known manner.

Figure 6:
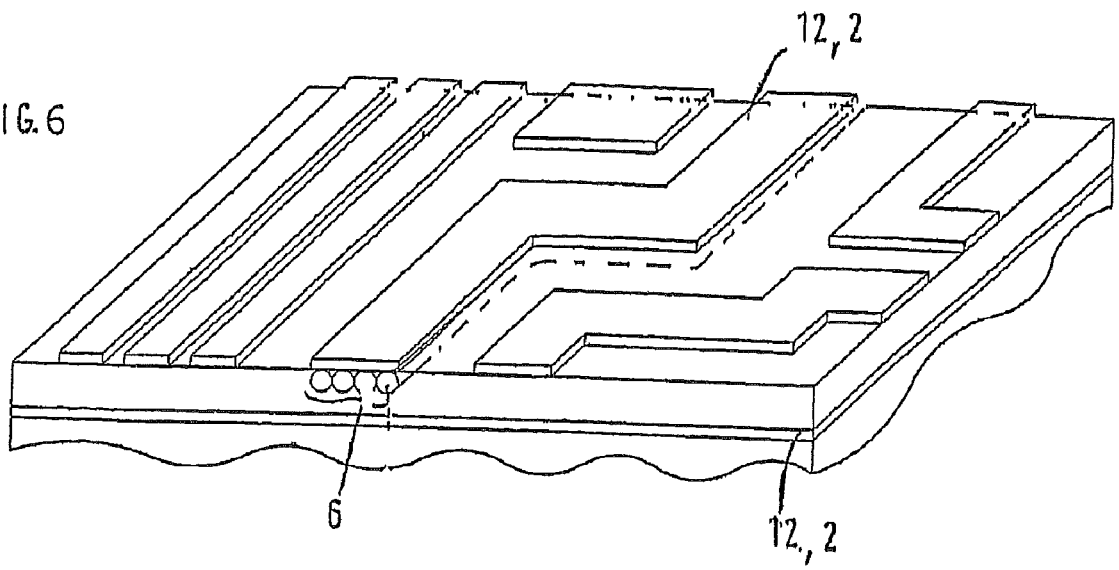
FIG. 6 is a further embodiment of the printed circuit board of FIG. 5.

In the embodiment according to FIG. 6, the conductor with the rectangular cross-section is formed by a large number of wires that are round when seen in the cross-section and that are arranged so that they lie next to one another and are touching, at least in sections. In this way, the result is a total cross-section that is essentially rectangular. In this way, it is also seen that the essentially rectangular structure of the conductors is not geometrically limited to an exact rectangle. Consequently, the conductor can also have a basic form that differs from a geometric rectangle, e.g., the edges can be rounded or the cross-section can be essentially oval. What is crucial is that the height of the conductors 6 corresponds to a multiple of the height of the strip conductors or the film on which the conductors 6 were applied during the manufacture of the printed circuit board in the way of wire-printing (conductors 6 follow the path of the strip conductors 12 adjacent to them). Provided that one selects a cross-section that is essentially rectangular, this can be formed so that it is very flat and has a comparatively large cross-sectional area, in order to be able to transport even comparatively large currents in this way. Due to the fact that the cross-section is at least square, it is ensured, given the corresponding height of the conductor, that this is at least as wide as it is high, but preferably considerably wider than it is high, whereby the term high should be seen corresponding to the depictions in the drawing, namely perpendicular to the flat expansion of the printed circuit board. In the embodiments in FIGS. 5 and 6, the layer 12 is formed by etching into strip conductors 2.

What is claimed is:

1. A wire-printed circuit board or card having etched connector points thereon and comprising (a) wire conductors that run in or on the circuit board or card between the etched connection points, with at least one of the wire conductors being fully embedded within the circuit board or card, and (b) etched strip conductors; wherein at least one of the embedded wire conductors has a rectangular cross-section and a side of the at least one embedded wire conductor of rectangular cross-section faces towards a major surface of the printed circuit board or card, provided that, in the case of a non-square rectangular cross-section of a wire conductor, a side of the wire conductor with the greater expansion faces towards the major surface.

2. A wire printed circuit board or card according to claim 1, wherein more than one of the wire conductors are fully embedded within the circuit board or card and have a rectangular cross-section.

3. A wire-printed circuit board or card having etched connection points thereon, and comprising (a) wire conductors that run in or on the circuit board or card between the etched connection points with one or more of the wire conductors being fully embedded within the circuit board or card, and (b) etched strip conductors; wherein (i) one or more of the fully embedded wire conductors have a hollow cross-section, (ii) at least one of the fully embedded wire conductors has a rectangular cross-section, and (iii) a side of the at least one wire conductor of rectangular cross-section faces towards a major surface of the printed circuit board or card, provided that, in the case of a non-square rectangular cross-section of a wire conductor, a side of the wire conductor with the greater expansion faces towards the major surface.

4. A wire-printed circuit board or card according to claim 3, wherein a medium circulates in the hollow cross-section of the conductor.

5. A wire-printed circuit board or card according to claim 4, wherein the medium is a coolant.

6. A wire-printed circuit board or card comprising etched strip conductors and wire conductors that run in or on the circuit board or card between connection points, wherein at least one of the wire conductors has a rectangular, hollow cross-section and a side of the rectangular wire conductor faces towards a major surface of the printed circuit board or card, provided that, in the case of a non-square rectangular cross-section of a wire conductor, a side of the wire conductor with the greater expansion faces towards the major surface, wherein a heating medium circulates in the hollow cross-section of the conductor.

7. A wire-printed circuit board or card comprising etched strip conductors and wire conductors that run in or on the circuit board or card between connection points, wherein at least one of the wire conductors has a rectangular cross-section and a side of the wire conductor faces towards a major surface of the printed circuit board or card, provided that, in the case of a non-square rectangular cross-section of a wire conductor, a side of the wire conductor with the greater expansion faces towards the major surface, and wherein at least one of the wire conductors having a rectangular cross-section is comprised of a plurality of individual wires disposed in abutting contact with each other in a pattern which is essentially rectangular in cross-section.

8. A wire-printed circuit board or card according to claim 7, wherein the individual wires are round in cross-section.

9. A wire-printed circuit board or card according to claim 6 or claim 7, wherein at least one of the wire conductors is disposed within the circuit board or card.

10. A wire-printed circuit board or card according to claim 8, wherein at least one of the wire conductors is fully embedded within the circuit board or card.

11. A wire-printed circuit board or card according to any one of claims 1, 2, 3, 6 or 7 wherein at least some of the embedded wire conductors having rectangular cross-sections cross each other within the circuit board or card.

12. A wire-printed circuit board or card according to any one of claims 3, 4 or 5 wherein at least one of the fully embedded wire structures has a hollow and rectangular cross section.

13. A wire-printed circuit board or card comprising etched strip conductors and wire conductors that run in or on the circuit board or card between connection points, at least some of the wire conductors being fully embedded within the circuit board or card, wherein at least some of the fully embedded wire conductors have a hollow, rectangular cross-section and a side of the embedded wire conductors faces towards a major surface of the printed circuit board or card, provided that, in the case of a non-square rectangular cross-section of a wire conductor, a side of the wire conductor with the greater expansion faces towards the major surface, and a heating medium circulates in the hollow cross-section of at least some of the wire conductors.

14. A wire-printed circuit board or card comprising etched strip conductors and wire conductors that run in or on the circuit board or card between connection points, wherein at least some of the wire conductors being fully embedded within the circuit board or card, wherein at least some of the fully embedded wire conductors have a hollow rectangular cross-section and a side of the embedded wire conductors faces towards a major surface of the printed circuit board or card, provided that, in the case of a non-square rectangular cross-section of a wire conductor, a side of the wire conductor with the greater expansion faces towards the major surface, and a cooling medium circulates in the hollow cross-section of at least some of the wire conductors.

* * * * *